United States Patent
Lee et al.

(10) Patent No.: US 9,436,202 B2
(45) Date of Patent: Sep. 6, 2016

(54) LOW POWER CIRCUIT FOR REDUCING LEAKAGE POWER USING NEGATIVE VOLTAGE

(71) Applicants: SAMSUNG ELECTRONICS CO., LTD., Suwon-si (KR); POSTECH ACADEMY-INDUSTRY FOUNDATION, Pohang-si (KR)

(72) Inventors: Jae Sup Lee, Yongin-si (KR); Seong Joong Kim, Suwon-si (KR); Bum Man Kim, Pohang-si (KR); Han-Kyu Lee, Pohang-si (KR); Dae-Chul Jeong, Pohang-si (KR); Tae Young Chung, Pohang-si (KR)

(73) Assignees: Samsung Electronics Co., Ltd., Suwon-si (KR); Postech Academy-Industry Foundation, Pohang-si (KR)

( * ) Notice: Subject to any disclaimer, the term of this patent is extended or adjusted under 35 U.S.C. 154(b) by 238 days.

(21) Appl. No.: 13/680,040

(22) Filed: Nov. 17, 2012

(65) Prior Publication Data

US 2013/0193948 A1  Aug. 1, 2013

(30) Foreign Application Priority Data

Jan. 26, 2012  (KR) .................. 10-2012-0007883

(51) Int. Cl.
*G05F 3/02*  (2006.01)
*H03K 17/06*  (2006.01)

(52) U.S. Cl.
CPC ............. *G05F 3/02* (2013.01); *H03K 17/063* (2013.01); *H03K 2017/066* (2013.01)

(58) Field of Classification Search
CPC ............. G05F 1/10; G05F 3/02; H03K 3/00; H03K 17/16; H02M 3/18; H02M 3/073
USPC ......... 323/311, 312, 314, 317; 327/108, 111, 327/337, 390, 543, 536; 363/59, 60
See application file for complete search history.

(56) References Cited

U.S. PATENT DOCUMENTS

| | | | |
|---|---|---|---|
| 5,539,341 A * | 7/1996 | Kuo ............................. | 327/108 |
| 6,424,202 B1 * | 7/2002 | Bartlett ....................... | 327/536 |
| 7,750,689 B1 * | 7/2010 | Rana et al. .................. | 327/108 |
| 7,893,752 B2 * | 2/2011 | Tanaka ........................ | 327/537 |
| 8,022,730 B2 | 9/2011 | Huang | |
| 2005/0218970 A1 * | 10/2005 | Kawai ................. | H03K 17/063 327/543 |
| 2006/0202737 A1 * | 9/2006 | Walter ........................ | 327/427 |
| 2009/0015224 A1 * | 1/2009 | Hirao ................... | H02M 3/158 323/282 |
| 2009/0033377 A1 * | 2/2009 | Hashimoto et al. ......... | 327/112 |
| 2010/0176872 A1 * | 7/2010 | Saikusa et al. .............. | 327/536 |
| 2011/0018619 A1 * | 1/2011 | Cassia ......................... | 327/537 |

FOREIGN PATENT DOCUMENTS

JP  2003-061337 A  2/2003
KR  10-2006-0089369 A  8/2006

* cited by examiner

*Primary Examiner* — Fred E Finch, III
*Assistant Examiner* — Gustavo Rosario Benitez
(74) *Attorney, Agent, or Firm* — NSIP Law

(57) ABSTRACT

A power circuit for reducing a leakage power using a negative voltage is provided. The power circuit includes a current source including a transistor including a gate. The power circuit further includes a current source control circuit connected to the gate of the transistor, and configured to apply a positive voltage to the gate of the transistor if the current source is to operate in an active mode, and apply the negative voltage to the gate of the transistor if the current source is to operate in an inactive mode.

3 Claims, 4 Drawing Sheets

100

LOW POWER CIRCUIT FOR REDUCING LEAKAGE POWER USING NEGATIVE VOLTAGE

CROSS-REFERENCE TO RELATED APPLICATION(S)

This application claims the benefit under 35 U.S.C. §119 (a) of Korean Patent Application No. 10-2012-0007883, filed on Jan. 26, 2012, in the Korean Intellectual Property Office, the entire disclosure of which is incorporated herein by reference for all purposes.

BACKGROUND

1. Field

The following description relates to a low power circuit for reducing a leakage power using a negative voltage.

2. Description of Related Art

A battery included in a mobile device has a limited amount of power. However, users want to use the mobile device for as long as possible without having to recharge the battery. In a local area network (LAN), such as a sensor network, use of batteries in mobile devices is limited even further.

An n-channel metal oxide semiconductor (NMOS) transistor may be used as a current source for a mobile device. In this example, the NMOS transistor supplies a current to other electrical circuits in an active mode, and halts supply of the current in an inactive mode. However, even in the inactive mode, a leakage current may flow through the NMOS transistor. Transitively, the leakage current is a major factor in battery power being wasted.

SUMMARY

In one general aspect, there is provided a power circuit using a negative voltage, including a current source including a transistor including a gate. The power circuit further includes a current source control circuit connected to the gate of the transistor, and configured to apply a positive voltage to the gate of the transistor if the current source is to operate in an active mode, and apply the negative voltage to the gate of the transistor if the current source is to operate in an inactive mode.

The current source control circuit may include a capacitor. The current source control circuit may be further configured to apply voltages to respective ends of the capacitor based on whether the current source is to operate in the active mode or the inactive mode. The current source control circuit may be further configured to apply the positive voltage or the negative voltage to the gate of the transistor to control the current source to operate in the active mode or the inactive mode, respectively, based on the voltages.

The current source control circuit may include a first sub control circuit, a second sub control circuit, and a capacitor interconnecting the first sub control circuit and the second sub control circuit. The first sub control circuit and the second sub control circuit may be configured to apply respective voltages to respective ends of the capacitor based on whether the current source is to operate in the active mode or the inactive mode. The second sub control circuit may be further configured to apply the negative voltage to the gate of the transistor to control the current source to operate in the inactive mode based on the respective voltages.

The first sub control circuit and the second sub control circuit may be further configured to apply a supply voltage and a ground voltage, respectively, to the respective ends, to charge the capacitor, if the current source is to operate in the active mode. The first sub control circuit and the second sub control circuit may be further configured to apply the ground voltage and the negative voltage, respectively, to the respective ends if the current source is to operate in the inactive mode.

The first sub control circuit may include a first switch transistor including a gate, and a second switch transistor including a gate, and connected to the first switch transistor. A switching voltage may be applied to the gate of the first switch transistor. An inverted switching voltage may be applied to the gate of the second switch transistor, the inverted switching voltage including an inverted voltage of the switching voltage.

The first switch transistor may be turned ON, and the second switch transistor may be turned OFF, if the switching voltage includes a high switching voltage corresponding to the active mode. The first switch transistor may be turned OFF, and the second switch transistor may be turned ON, if the switching voltage includes a low switching voltage corresponding to the inactive mode.

The first switch transistor may include a terminal. The second switch transistor may include a terminal. A supply voltage may be applied to the terminal of the first switch transistor. A ground voltage may be applied to the terminal of the second switch transistor.

The capacitor, the first switch transistor, and the second switch transistor may be connected at a first node.

The second sub control circuit may include one or more third switch transistors including respective gates, and serially-connected to each other, and a fourth switch transistor including a gate, and connected to the one or more third switch transistors. A switching voltage may be applied to the respective gates of the one or more third switch transistors. An inverted switching voltage may be applied to the gate of the fourth switch transistor, the inverted switching voltage including an inverted voltage of the switching voltage.

The one or more third switch transistors may be turned ON, and the fourth switch transistor may be turned OFF, if the switching voltage includes a high switching voltage corresponding to the active mode. The one or more third switch transistors may be turned OFF, and the fourth switch transistor may be turned ON, if the switching voltage includes a low switching voltage corresponding to the inactive mode.

The one or more third switch transistors may include a terminal. A ground voltage may be applied to the terminal of the one or more third switch transistors. The fourth switch transistor may be connected to the gate of the transistor.

The capacitor, the one or more third switch transistors, and the fourth switch transistor may be connected at a second node.

The second sub control circuit may include at least two third switch transistors including respective gates, and serially-connected to each other. A switching voltage may be applied to the respective gates of the at least two third switch transistors.

In another general aspect, there is provided a power circuit using a negative voltage, including a current source including a transistor including a gate. The power circuit further includes a current source control circuit connected to a gate of the transistor, and including a capacitor, a first sub control circuit configured to apply a first voltage to a first node of the capacitor based on a switching signal and an inverted switching signal, and a second sub control circuit configured to apply a second voltage to a second node of the capacitor based on the switching signal and the inverted switching signal. The current source control circuit is configured to apply a positive voltage or a negative voltage to the gate of the transistor to control the current source to operate in an active mode or an inactive mode, respectively, based on the first voltage and the second voltage.

The first voltage may be a ground voltage, and the second voltage may be the negative voltage, if the switching signal and the inverted switching signal correspond to the inactive mode. The second sub control circuit may be further configured to apply the negative voltage to the gate of the transistor to control the current source to operate in the inactive mode if the first voltage is the ground voltage and the second voltage is the negative voltage.

The first sub control circuit may include a first switch transistor configured to receive the switching signal, and a second switch transistor connected to the first switch transistor, and configured to receive the inverted switching signal. The capacitor, the first switch transistor, and the second switch transistor may be connected at a first node.

The second sub control circuit may include one or more third switch transistors configured to receive the switching signal, and a fourth switch transistor connected to the one or more third switch transistors, and configured to receive the inverted switching signal. The capacitor, the one or more third switch transistors, and the fourth switch transistor may be connected at a second node.

The second sub control circuit may include at least two third switch transistors serially-connected to each other, and configured to receive the switching signal.

A capacitance of the capacitor may be automatically-controlled.

In still another general aspect, there is provided a power circuit using a negative voltage, including a transistor including a gate. The power circuit further includes a control circuit connected to the gate of the transistor, and configured to apply the negative voltage to the gate of the transistor if the transistor is to be turned OFF.

Other features and aspects will be apparent from the following detailed description, the drawings, and the claims.

Figure 1:
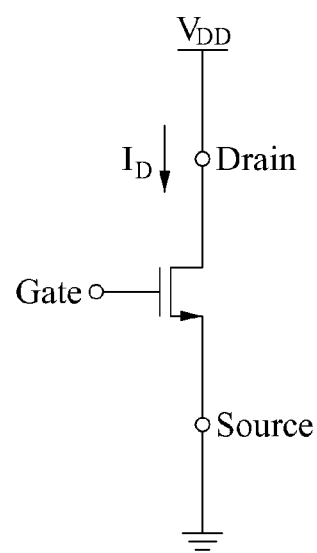
FIG. 1 is a diagram illustrating a current source including an n-channel metal oxide semiconductor (NMOS) transistor according to a related art.

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

The following detailed description is provided to assist the reader in gaining a comprehensive understanding of the methods, apparatuses, and/or systems described herein. Accordingly, various changes, modifications, and equivalents of the systems, apparatuses, and/or methods described herein will be suggested to those of ordinary skill in the art. The progression of processing steps and/or operations described is an example; however, the sequence of steps and/or operations is not limited to that set forth herein and may be changed as is known in the art, with the exception of steps and/or operations necessarily occurring in a certain order. Also, description of well-known functions and constructions may be omitted for increased clarity and conciseness.

FIG. 1 illustrates a current source 100 including an n-channel metal oxide semiconductor (NMOS) transistor according to a related art. Referring to FIG. 1, the NMOS transistor includes a gate, a drain, and a source. A supply voltage $V_{DD}$ is applied to the drain, and the source is connected to ground.

The current source 100 outputs a current $I_D$ flowing from the drain to the source based on a gate-source voltage $V_{GS}$ of the NMOS transistor. That is, when the gate-source voltage $V_{GS}$ is greater than a threshold voltage $V_{th}$ of the NMOS transistor, the NMOS transistor is turned ON, and the current source 100 operates in an active mode. When turned ON, the NMOS transistor outputs the current $I_D$. Conversely, when the gate-source voltage $V_{GS}$ is less than the threshold voltage $V_{th}$ of the NMOS transistor, the NMOS transistor is turned OFF, and the current source 100 operates in an inactive mode. In an ideal case, when turned off, no current flows through the NMOS transistor.

However, in actuality, when turned off, a leakage current $I_D$ flows through the NMOS transistor even though the current source 100 is in the inactive mode. The leakage current $I_D$ may expend battery power of a wireless communication device, such as, for example, a mobile device and/or others device known to one of ordinary skill in the art. The leakage current $I_D$ may be expressed by the example of Equation 1.

$$I_D \cong I_{D0} e^{\frac{V_{GS}-V_{th}}{nV_T}} \quad \text{[Equation 1]}$$

In Equation 1, $I_{D0}$ is a positive constant, n denotes a constant representing a property of a material of the NMOS transistor, and $V_t$ denotes a thermal voltage of the NMOS transistor.

Figure 2:
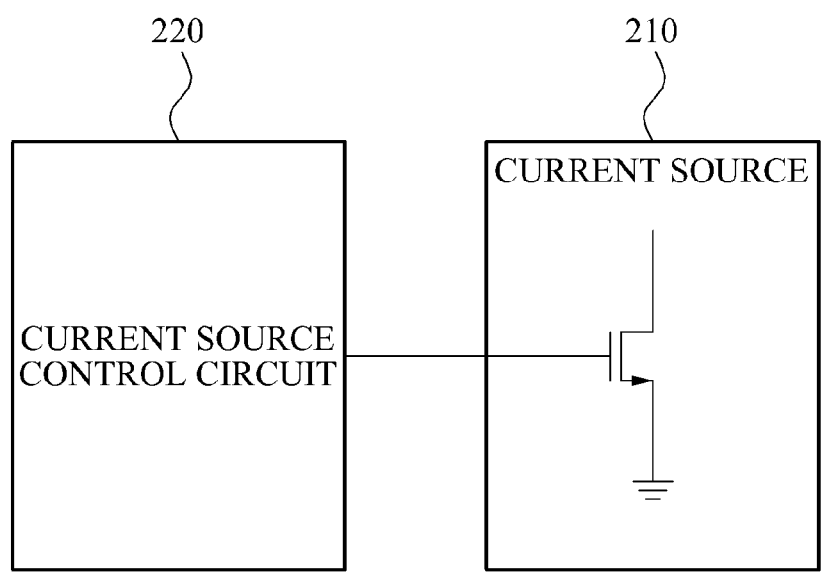
FIG. 2 is a diagram illustrating an example of a current source and a current source control circuit.

FIG. 2 illustrates an example of a current source 210 and a current source control circuit 220. Referring to FIG. 2, a low power circuit using a negative power includes the current source 210 and the current source control circuit 220.

The current source 210 may include a transistor, such as, for example, an NMOS transistor and/or other transistors known to one of ordinary skill in the art. The transistor includes a gate, a drain, and a source. The gate is electrically-connected to the current source control circuit 220.

The current source 210 operates in either an active mode or an inactive mode. In the active mode, the current source 210 is turned ON, and outputs a current $I_D$ flowing from the drain to the source. In the inactive mode, the current source 210 is turned OFF, and the current is a leakage current $I_D$. To turn ON the current source 210 in the active mode, a voltage is applied to the gate such that a gate-source voltage $V_{GS}$ of the transistor is greater than a threshold voltage $V_{th}$ of the transistor. Conversely, to turn OFF the current source 210 in the inactive mode, a voltage is applied to the gate such that the gate-source voltage $V_{GS}$ is less than the threshold voltage $V_{th}$.

In more detail, to turn OFF the current source 210 in the inactive mode, the voltage is applied to the gate such that the gate-source voltage $V_{GS}$ is negative and less than the threshold voltage $V_{th}$. Hereinafter, it is presumed that a source voltage of the transistor is 0 V. Accordingly, hereinafter, application of a negative voltage to the gate means that the voltage is applied to the gate so that the gate-source voltage $V_{GS}$ is negative. If the source voltage is greater than 0 V, the gate-source voltage $V_{GS}$ may be negative even with a positive voltage being applied to the gate. Such an example is also included in the application of the negative voltage to the gate.

Therefore, when the current source 210 is to operate in the active mode, the current source control circuit 220 applies the positive voltage to the gate of the transistor of the current source 210, which means that the voltage is applied to the gate so that the gate-source voltage $V_{GS}$ is positive. When the current source 210 is to operate in the inactive mode, the current source control circuit 220 applies the negative voltage to the gate of the transistor of the current source 210, which means that the voltage is applied to the gate so that the gate-source voltage $V_{GS}$ is negative.

As can be appreciated from Equation 1, the leakage current $I_D$ is considerably reduced when the gate-source voltage $V_{GS}$ is negative. For example, in Equation 1, if a constant n is 1 and a thermal voltage $V_T$ is 26 millivolts (mV), the leakage current $I_D$ is reduced by a factor of about 46.8 each time the gate-source voltage $V_{GS}$ is reduced by 100 mV. That is, when the gate-source voltage $V_{GS}$ is negative, almost no leakage current is generated. Consequently, a lifetime of a battery may be extended.

Figure 3:
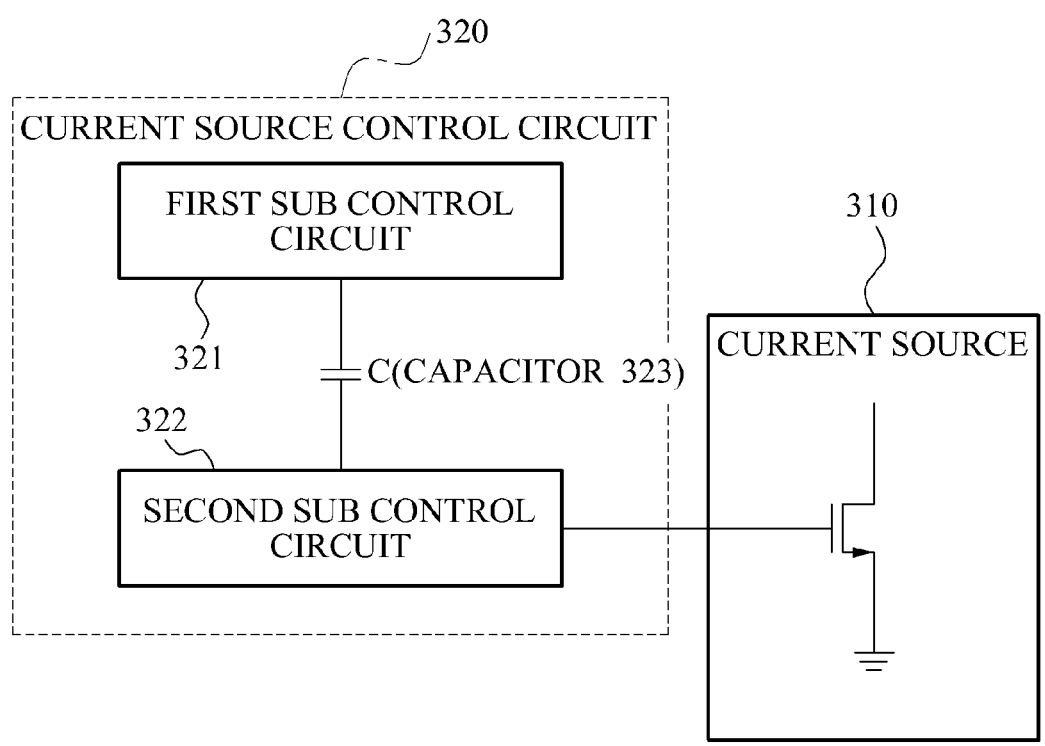
FIG. 3 is a diagram illustrating an example of a current source, a first sub control circuit, a second sub control circuit, and a capacitor.

FIG. 3 illustrates an example of a current source 310, a first sub control circuit 321, a second sub control circuit 322, and a capacitor 323. Referring to FIG. 3, a low power circuit using a negative voltage includes the current source 310 and a current source control circuit 320 including the first sub control circuit 321, the second sub control circuit 322, and the capacitor 323. The current source 310 may correspond to the current source 210 of FIG. 2, so further description of the current source 310 is omitted for increased clarity and conciseness.

When the current source 310 operates in an active mode, the capacitor 323 is charged. That is, when the current source 310 operates in the active mode, the first sub control circuit 321 applies a high voltage, for example, $V_{DD}$, to an upper node of the capacitor 323. The second sub control circuit 322 applies a low voltage, for example, 0 V, to a lower node of the capacitor 323.

When the current source 310 is to operate in an inactive mode from the active mode, the first sub control circuit 321 applies the low voltage to the upper node of the capacitor 323. The second sub control circuit 322 applies a negative high voltage, for example, $-V_{DD}$, to the lower node of the capacitor 323. The second sub control circuit 322 applies the negative high voltage to a gate of the current source 310, thereby reducing a leakage current $I_D$ flowing through the current source 310.

As the current source 310 maintains the inactive mode, the negative high voltage applied to the lower node of the capacitor 323 gradually approximates to 0 V over time. The second sub control circuit 322 may be predetermined to relatively extend or shorten a duration in which the second sub control circuit 322 maintains the negative high voltage at the lower node of the capacitor 323. Furthermore, to relatively extend or shorten the duration of maintaining the negative high voltage, a capacitance of the capacitor 323 may be optimized (i.e., predetermined) and/or dynamically-controlled (e.g., based on an user selection).

Figure 4:
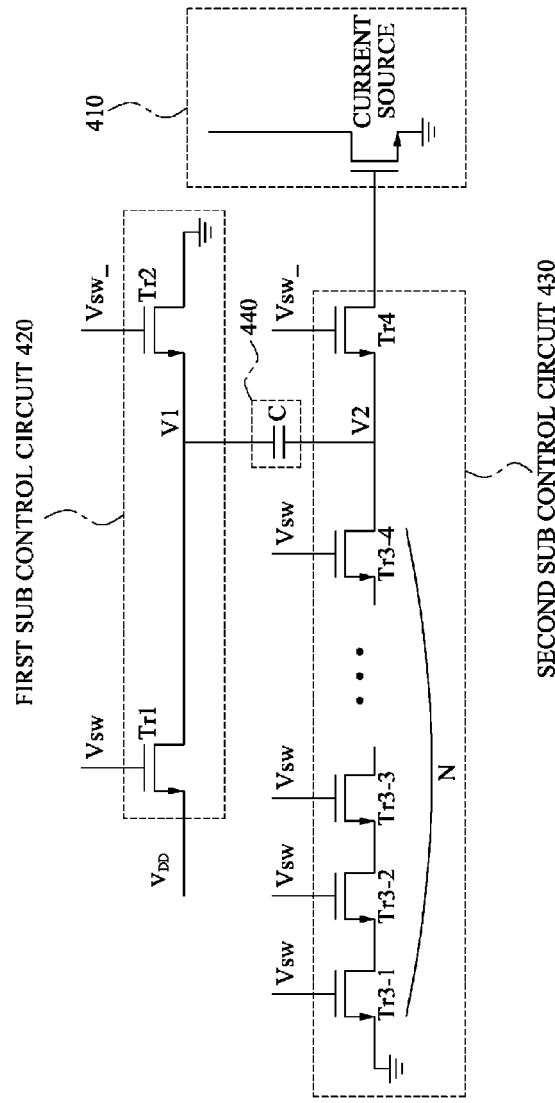
FIG. 4 is a diagram illustrating an example of a low power circuit using a negative voltage.

FIG. 4 illustrates an example of a low power circuit using a negative voltage. Referring to FIG. 4, the low power circuit includes a current source 410, a first sub control circuit 420, a second sub control circuit 430, and a capacitor 440. The first sub control circuit 420 includes a first switch transistor Tr1 and a second switch transistor Tr2, and the second sub control circuit 430 includes N third switch transistors, for example, third switch transistors Tr3-1, Tr3-2, Tr3-3, and Tr3-4, and a fourth switch transistor Tr4. The first switch transistor Tr1, the second switch transistor Tr2, and the capacitor 440 are connected at a node V1, and the third switch transistor Tr3-4, the fourth switch transistor Tr4, and the capacitor 440 are connected at a node V2. The current source 410 may correspond to the current source 210 of FIG. 2, so further description of the current source 410 is omitted for increased clarity and conciseness.

$V_{SW}$ denotes a switching signal, and $V_{SW\_}$ denotes an inverted switching signal. Although not shown in FIG. 4, the switching signal $V_{SW}$ is inverted to the inverted switching signal $V_{SW\_}$ through an inverter. The switching signal $V_{SW}$ is applied to a gate of the first switch transistor Tr1 and respective gates of the third switch transistors Tr3-1, Tr3-2, Tr3-3, and Tr3-4, and the inverted switching signal $V_{SW\_}$ output by the inverter is applied to a gate of the second switch transistor Tr2 and a gate of the fourth switch transistor Tr4. In addition, a supply voltage $V_{DD}$ is referred to as a high voltage, and is applied to a terminal of the first switch transistor Tr1. A ground voltage of 0 V is referred to as a low voltage, and is applied to a terminal of the second switch transistor Tr2 and a terminal of the third switch transistor Tr3-1. That is, the respective terminals of the second switch transistor Tr2 and the third switch transistor Tr3-1 are connected to ground.

When the switching signal $V_{SW}$ is a high switching voltage, that is, corresponds to a logic value 1, the first switch transistor Tr1 and the third switch transistors Tr3-1, Tr3-2, Tr3-3, and Tr3-4 are turned ON. Meanwhile, the second switch transistor Tr2 and the fourth switch transistor Tr4 are turned OFF. A voltage at the node V1 becomes the supply voltage $V_{DD}$, and a voltage at the node V2 becomes the ground voltage. That is, the capacitor 440 is charged. A voltage difference between the node V1 and the node V2 becomes the supply voltage $V_{DD}$. In this example, the current source 410 operates in an active mode, which corresponds to the high switching voltage.

When the switching signal $V_{SW}$ is a low switching voltage, that is, corresponds to a logic value 0, the second switch transistor Tr2 and the fourth switch transistor Tr4 are turned ON. Meanwhile, the first switch transistor Tr1 and the third switch transistors Tr3-1, Tr3-2, Tr3-3, and Tr3-4 are turned OFF. The voltage at the node V1 becomes the ground voltage, and the voltage at the node V2 becomes a negative voltage $-V_{DD}$ due to the capacitor 440. The negative voltage $-V_{DD}$ is applied to a gate of the current source 410 through the fourth switch transistor Tr4, which is turned ON. Accordingly, the current source 410 operates in an inactive mode, which corresponds to the low switching voltage. Since a negative voltage is applied to the gate of the current source 410, a gate-source voltage $V_{GS}$ of the current source 410 is negative.

The negative voltage $-V_{DD}$ at the node V2 approximates to the ground voltage over time due to a leakage current flowing through the third switch transistors Tr3-1, Tr3-2, Tr3-3, and Tr3-4. To maintain the negative voltage $-V_{DD}$ at the node V2, that is, the negative state of the gate-source voltage $V_{GS}$ of the current source 410 for as long as possible, the leakage current of the third switch transistors Tr3-1, Tr3-2, Tr3-3, and Tr3-4 may be reduced. For example, to reduce the leakage current flowing through the third switch transistors Tr3-1, Tr3-2, Tr3-3, and Tr3-4, a number N of the third switch transistors may be increased, and the third switch transistors may be serially-connected to each other. However, considering that an increase in the number N of the third switch transistors increases a surface area of the second sub control circuit 430 and cost, the number N of the third switch transistors to be serially-connected needs to be properly controlled based on environments and requirements of a communication device or an electronic device.

In another example, to maintain the negative voltage $-V_{DD}$ at the node V2, a capacitance of the capacitor 440 may be increased via, e.g., optimization (i.e., predetermination) and/or dynamic control (e.g., based on an user selection). However, the increase in the capacitance may also increase the surface area of the low power circuit and the cost. Moreover, the increase in the capacitance may increase power needed to generate the negative voltage $-V_{DD}$. Accordingly, the capacitance needs to be properly set to an optimal value based on the environments and the requirements of the communication device or the electronic device. If the dynamic control of the capacitance is available, the capacitance may be dynamically controlled based on an user selection and/or the environments and the requirements of the communication device or the electronic device.

The low power circuit according to the example of FIG. 4 will be described again. The low power circuit includes the current source 410 and a current source control circuit including the first sub control circuit 420, the second sub control circuit 430, and the capacitor 440. The current source control circuit controls the current source 410 to operate in the active mode or the inactive mode based on the voltages applied to respective ends of the capacitor 440. For example, when the current source 410 is to operate in the inactive mode, the current source control circuit applies the negative voltage $-V_{DD}$ to the gate of the current source 410 based on the voltages applied to the respective ends of the capacitor 440.

In more detail, the first sub control circuit 420 and the second sub control circuit 430 determine the respective voltages to be applied to the respective ends of the capacitor 440 based on the switching signal $V_{SW}$, that is, an operation mode of the current source 410. The first sub control circuit 420 includes the first switch transistor Tr1, and the second switch transistor Tr2 electrically-connected to the first switch transistor Tr1. The first sub control circuit 420 may further include an inverter configured to invert a voltage of the switching signal $V_{SW}$ applied to the gate of the first switch transistor Tr1, and apply the inverted voltage to the gate of the second switch transistor Tr2. In the active mode, the first switch transistor Tr1 is turned ON, while the second switch transistor Tr2 is turned OFF. In the inactive mode, the first switch transistor Tr1 is turned OFF, while the second switch transistor Tr2 is turned ON.

The second sub control circuit 430 includes the third switch transistors Tr3-1, Tr3-2, Tr3-3, and Tr3-4 serially connected to each other, and the fourth switch transistor Tr4 electrically connected to the third switch transistor Tr3-4. The second sub control circuit 430 may further include an inverter configured to invert the voltage of the switching signal $V_{SW}$ applied to the respective gates of the third switch transistors Tr3-1, Tr3-2, Tr3-3, and Tr3-4, and apply the inverted voltage to the gate of the fourth switch transistor Tr4. In the active mode, the third switch transistors Tr3-1, Tr3-2, Tr3-3, and Tr3-4 are turned ON, while the fourth switch transistor Tr4 is turned OFF. In the inactive mode, the third switch transistors Tr3-1, Tr3-2, Tr3-3, and Tr3-4 are turned OFF, while the fourth switch transistor Tr4 is turned ON.

The first sub control circuit 420 and the second sub control circuit 430 may use the same inverter. The second sub control circuit 430 may include at least two third switch transistors serially-connected to each other. The same voltage of the switching signal $V_{SW}$ may be applied to gates of the at least two third switch transistors.

The aforementioned low power circuit using the negative voltage may be effectively applied to wireless communication devices, such as, for example, mobile devices accessing a sensor network, an ad hoc network, and/or other networks known to one of ordinary skill in the art. In addition, a manufacturing method for the circuits described in the foregoing examples is also included in the scope of the examples.

The above-described examples may be recorded, stored, or fixed in one or more non-transitory computer-readable media that includes program instructions to be implemented by a computer to cause a processor to execute or perform the program instructions. The media may also include, alone or in combination with the program instructions, data files, data structures, and the like. The program instructions recorded on the media may be those designed and constructed, or they may be of the kind well-known and available to those having skill in the computer software arts. Examples of non-transitory computer-readable media include magnetic media such as hard disks, floppy disks, and magnetic tape; optical media such as CD ROM discs and DVDs; magneto-optical media such as optical discs; and hardware devices that are configured to store and perform program instructions, such as read-only memory (ROM), random access memory (RAM), flash memory, and the like. Examples of program instructions include both machine code, such as produced by a compiler, and files including higher level code that may be executed by the computer using an interpreter. The described hardware devices may be configured to act as one or more software modules in order to perform the operations and methods described above, or vice versa.

As a non-exhaustive illustration only, a device described herein may refer to mobile devices such as a cellular phone, a personal digital assistant (PDA), a digital camera, a portable game console, and an MP3 player, a portable/personal multimedia player (PMP), a handheld e-book, a portable laptop PC, a global positioning system (GPS) navigation, a tablet, a sensor, and devices such as a desktop PC, a high definition television (HDTV), an optical disc player, a setup box, a home appliance, and the like that are capable of wireless communication or network communication consistent with that which is disclosed herein.

A number of examples have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A power circuit comprising:
   a current source comprising a current source transistor comprising a current source gate; and
   a current source control circuit comprising a first sub control circuit, a capacitor having an upper node and a lower node, and a second sub control circuit,
   wherein the first sub control circuit comprises:
      a first transistor configured to pass a supply voltage to the upper node when the current source is active, and to isolate the upper node from the supply voltage when the current source is inactive;
      a second transistor configured to isolate the upper node from a ground when the current source is active, and to ground the upper node when the current source is inactive,
   wherein the second sub control circuit comprises:
      a series of at least a fourth transistor and a fifth transistor configured to ground the lower node when the current source is active, and configured to isolate the lower node from the ground when the current source is inactive; and
      a sixth transistor configured to isolate the lower node from the current source gate when the current source is active, and configured to electrically connect the lower node to the current source gate when the current source is inactive, wherein a negative voltage is generated in the lower node when the current source is inactive, and wherein a duration of the negative voltage is based on a total number of the series of at least the fourth transistor and the fifth transistor.

2. The power circuit of claim 1,
   wherein the first transistor and the series of at least the fourth transistor and the fifth transistor are all controlled by a switching signal, and
   wherein the switching signal has a high voltage when the current source is active and has a low voltage when the current source is inactive.

3. The power circuit of claim 1,
   wherein the second transistor and the sixth transistor are both controlled by an inverted switching signal, and
   wherein the inverted switching signal has a low voltage when the current source is active and has a high voltage when the current source is inactive.

* * * * *